United States Patent

Weber et al.

(10) Patent No.: US 8,547,181 B2
(45) Date of Patent: Oct. 1, 2013

(54) OSCILLATOR WITH OHMICALLY ADJUSTABLE OSCILLATION FREQUENCY

(75) Inventors: Rainer Weber, Offenburg (DE); Ingmar Kallfass, Strasbourg (FR)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 85 days.

(21) Appl. No.: 13/196,612

(22) Filed: Aug. 2, 2011

(65) Prior Publication Data

US 2012/0025920 A1    Feb. 2, 2012

Related U.S. Application Data

(63) Continuation of application No. PCT/EP2010/051269, filed on Feb. 3, 2010.

(30) Foreign Application Priority Data

Feb. 10, 2009   (DE) .......................... 10 2009 008 225

(51) Int. Cl.
*H03B 5/18* (2006.01)

(52) U.S. Cl.
USPC .............. 331/107 SL; 331/177 R; 331/96

(58) Field of Classification Search
USPC ............ 331/96, 107 DP, 107 SL, 177 R, 331/179
See application file for complete search history.

(56) References Cited

U.S. PATENT DOCUMENTS

| | | | | |
|---|---|---|---|---|
| 4,639,691 A | * | 1/1987 | Iigima | 331/99 |
| 4,990,865 A | * | 2/1991 | Martheli | 331/99 |
| 4,990,866 A | | 2/1991 | Martheli | |
| 5,187,451 A | | 2/1993 | Nakamoto et al. | |
| 5,629,652 A | | 5/1997 | Weiss | |
| 5,734,305 A | * | 3/1998 | Ervasti | 333/204 |
| 5,990,580 A | | 11/1999 | Weigand | |
| 6,542,051 B1 | * | 4/2003 | Nakada | 333/164 |
| 6,720,850 B2 | | 4/2004 | Sasabata et al. | |
| 2002/0050866 A1 | * | 5/2002 | Aki | 331/100 |
| 2007/0075799 A1 | | 4/2007 | Jang et al. | |
| 2007/0188256 A1 | | 8/2007 | Maheshwari | |

FOREIGN PATENT DOCUMENTS

| | | |
|---|---|---|
| DE | 199 09 521 | 9/1999 |
| DE | 102 15 761 | 11/2002 |
| JP | H08316731 | 11/1996 |
| JP | 2004312104 | 11/2004 |

* cited by examiner

*Primary Examiner* — Ryan Johnson
(74) *Attorney, Agent, or Firm* — Michael A. Glenn; Perkins Coie LLP

(57) ABSTRACT

An oscillator with adjustable oscillation frequency includes an active device showing a negative input resistance at a terminal, an oscillator circuit coupled to the terminal of the active device showing the negative input resistance, and an element with adjustable ohmic resistance by which the oscillation frequency of the oscillator is adjustable.

5 Claims, 3 Drawing Sheets

OSCILLATOR WITH OHMICALLY ADJUSTABLE OSCILLATION FREQUENCY

CROSS-REFERENCE TO RELATED APPLICATIONS

This application is a continuation of copending International Patent Application No. PCT/EP2010/051269, filed Feb. 3, 2010, which is incorporated herein by reference in its entirety, and additionally claims priority from German Patent Application No. 102009008225.5, filed Feb. 10, 2009, which is incorporated herein by reference in its entirety.

BACKGROUND OF THE INVENTION

The present invention relates to an oscillator with ohmically adjustable oscillation frequency.

Oscillators are circuits for generating high-frequency vibrations. The core of an oscillator is an active device having a non-linear characteristic curve, such as a transistor or a diode. The oscillation frequency f of the oscillator is determined by an oscillator circuit and its effective capacitance C and inductance L:

$$f = \frac{1}{2 \cdot \pi \cdot \sqrt{L \cdot C}}$$

The oscillator circuit, that can also be referred to as resonator, can be realized with all frequency-selective devices whose behavior can be described by an equivalent circuit diagram of capacitance and inductance. Examples of this are discrete LC oscillator circuits, dielectric resonators, cavity resonators or line resonators.

Apart from fixed-frequency oscillators having only one oscillation frequency, there are also oscillators that can be varied in their oscillation frequency. The oscillation frequency can be varied by mechanically or electrically changing frequency-determining devices of the oscillator circuit. Mechanically variable devices cannot be considered in many applications where fast frequency change is necessitated. For such applications, voltage-controlled devices are used in the oscillator. If voltage-controlled devices are used in oscillators, the same are called voltage-controlled oscillators or VCOs. In conventional VCO concepts, the voltage-dependent barrier layer capacitance of varactor diodes or the voltage-controlled capacitance of a transistor is used for changing the effective capacitance of the resonator and hence for varying the oscillation frequency of the oscillator.

A general problem of monolithically integrated circuits is the dependency on a certain technology and its transistor architecture. Thus, transistors are optimized for speed for the millimeter wave range, from which, however, no varactor diodes having optimum characteristics can be realized. Above that, monolithically integrated VCOs operating with varactor diodes frequently have a bandwidth of 5 to 8% in relation to the average oscillation frequency. A higher bandwidth of, for example, more than 10% with monolithically integrated varactor diodes is associated with increased effort and complexity.

SUMMARY

According to an embodiment, an oscillator with an oscillation frequency adjustable in a voltage-controlled manner may have: an active device showing a negative input resistance at a terminal; an oscillator circuit coupled to the terminal of the active device showing the negative input resistance; and an element with an ohmic resistance adjustable in a voltage-controlled manner, by which the oscillation frequency of the oscillator can be continuously adjusted, wherein the oscillator circuit comprises a resonator line, wherein the length of the resonator line effective for oscillation generation is adjustable by the element with adjustable ohmic resistance.

Embodiments of the invention provide an oscillator with adjustable oscillation frequency, comprising:

an active device showing a negative input resistance at a terminal;

an oscillator circuit coupled to the terminal of the active device showing the negative input resistance; and an element with adjustable ohmic resistance by which the oscillation frequency of the oscillator can be adjusted.

In embodiments of the invention, the impedance of the oscillator circuit and/or the impedance of the circuit structure to which the active element is connected to generate the negative input resistance can be varied by the element with adjustable ohmic resistance. In embodiments, the effective length of a resonator line forming the oscillator circuit can be adjusted by the element with adjustable ohmic resistance to thereby adjust the resonant frequency of the oscillator. In embodiments of the invention, the element with adjustable ohmic resistance can be a transistor whose ohmic resistance can be adjusted via its control voltage. In embodiments of the invention, the oscillation frequency of the oscillator can be continuously adjustable.

Embodiments of the present invention allow higher tuning bandwidths of an oscillator with adjustable oscillation frequency than can be obtained by conventional methods. Thus, the present invention is particularly interesting for monolithically integrated VCOs in the millimeter and sub-millimeter wave range starting from 30 GHz where a large tuning bandwidth is necessitated. Especially in radar systems, there is a direct connection of bandwidth and spatial resolution.

Advantageously, the inventive concept allows integration of oscillators with existing transmitting/receiving circuits and radar circuits on a chip. Thereby, the assembly effort can be reduced and complete systems can be implemented smaller, lighter and in a more energy-saving manner, which can again reduce costs.

Thus, embodiments of the invention provide voltage-controlled oscillators (VCOs) using an ohmically tunable element or a voltage-controlled resistor as frequency-determining device. In embodiments, a transistor connected in parallel is used as frequency-determining device. In embodiments, the element is connected to an adjustable ohmic resistance to change the effective electric length or the impedance of a high-frequency line by changing the ohmic resistance of the same. Generally, an element with adjustable ohmic resistance can be used in any feed line of the transistor, to thereby influence the behavior of the transistor such that the resonant frequency of the oscillator changes by changing the ohmic resistance. In embodiments, the oscillator can have only two discrete oscillation frequencies, by switching the element with adjustable ohmic resistance between two extreme values. By this switching, in embodiments, switching can be performed between two extreme values of the adjustable electric length or impedance of a high-frequency line.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
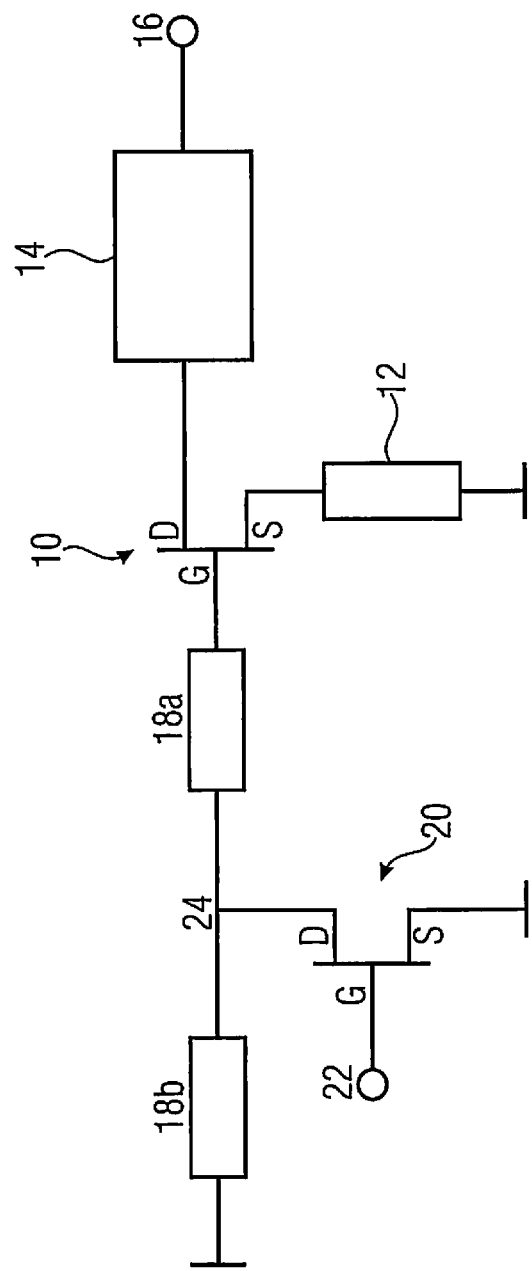
FIG. 1 is a first embodiment of an inventive oscillator.

In the embodiment shown in FIG. 1, the oscillator comprises an active element in the form of a field-effect transistor 10. The source terminal S of the field-effect transistor 10 is connected to a reference potential, for example ground, via an element 12 for generating instability. The drain terminal D of the field-effect transistor 10 is connected to an output 16 of the oscillator by an impedance matching network 14.

The element 12 for generating instability is implemented to provide a negative input resistance at a gate terminal G of the field-effect transistor 10.

A line resonator having resonator line portions 18a and 18b is connected to the gate terminal G of the field-effect transistor 10. The line resonator presents an oscillator circuit coupled to gate terminal G.

Line resonators can be implemented by short-circuited or open high-frequency lines at the ends of which high-frequency energy is reflected, such that a standing wave is formed. Thereby, the resonant frequency of the oscillator depends on the length of the resonator line. A long line effects a lower and a short line a higher oscillation frequency. Correspondingly, in embodiments of the invention, the line resonator or the resonator line portions can be implemented as short-circuited or open high-frequency lines.

Further, the oscillator comprises a further field-effect transistor 20 representing an element with adjustable ohmic impedance. More specifically, the ohmic resistance between drain terminal and source terminal of the transistor 20 can be adjusted by varying the voltage at the gate terminal G of the transistor 20 via a control terminal 22.

The ohmically variable element formed by the transistor 20 is connected between a tap 24 between the resonator line portions 18a and 18b and a reference potential, e.g. ground. Thus, this element 22 represents a transistor connected in parallel, a so-called shunt transistor.

Depending on a control voltage at the control terminal 22, the transistor 20 allows a variable current flow from the tap 24 towards the reference potential. Thereby, the effective length and impedance of the line resonator connected to the gate of the transistor 10 can be changed via the control voltage of the transistor 20.

In an extreme case, when the transistor 22 is conductive, the signal conductor of the resonator line is short-circuited at the position of the tap 24, and the reduced resonator length of the resonator line portion 18a is effective. In the opposite extreme case, the whole length of the resonator line, i.e. the combined length of resonator line portions 18a and 18b is effective when the transistor 20 is in an open state.

During operation, the oscillator in FIG. 1 can be powered, for example, via the matching network 14, wherein an oscillator output signal with oscillation frequency is generated at the output 16. A power supply can be implemented, for example, by a connection of the drain terminal of the field-effect transistor 10 with a supply potential via a choke coil. The oscillation frequency of the output signal can be adjusted via changing the control voltage of the transistor 20. For example, switching can be performed between two oscillating frequencies by turning the transistor 20 on and off. Alternatively, fine-tuning of the oscillation frequency can be performed by controlling the resistance of the transistor to respective intermediate values.

Figure 2:
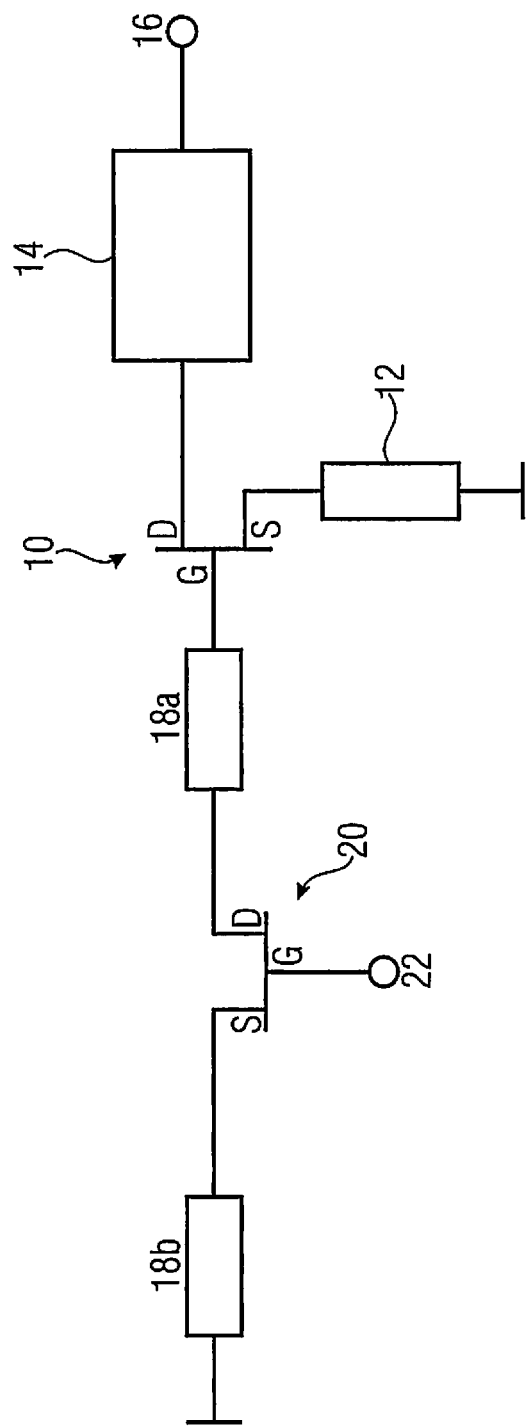
FIG. 2 is a second embodiment of an inventive oscillator.

FIG. 2 shows an alternative embodiment where the transistor 20 is not connected as a transistor connected in parallel, but is connected in series between the two resonator line portions 18a and 18b. Here, by varying the control voltage at the terminal 22, the effective length or impedance of the resonator line and thus the oscillation frequency can also be adjusted. The impedance of the transistor is again variable between an open state and a conductive state. In the open state of the transistor 20, only the length of the resonator line portion 18a is effective, while in the conducting state, the length of both resonator line portions 18a and 18b is effective. Thus, even in the embodiment shown in FIG. 2, the oscillation frequency of the oscillator signal at the output 16 can be adjusted by controlling the resistance of the transistor 20.

Figure 3:
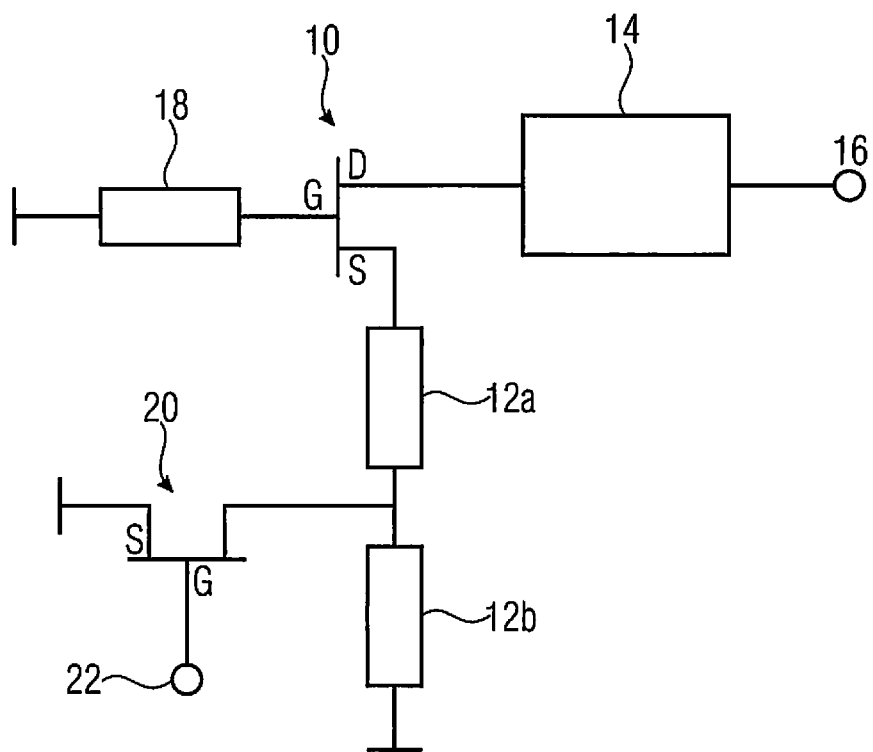
FIG. 3 is a third embodiment of an inventive oscillator.

In the embodiments shown in FIGS. 1 and 2, the element with adjustable ohmic resistance is provided to vary the impedance of the oscillator circuit of the oscillator. FIG. 3 shows an alternative embodiment wherein an element with adjustable ohmic resistance, again formed by a transistor 20, is provided to vary the impedance of the circuit structure responsible for generating the negative input resistance of the active element 10. Thereby, the oscillation frequency of the oscillator signal at the output 16 can also be adjusted.

In the embodiment shown in FIG. 3, a line resonator 18 is connected to the gate terminal of the active element 10. The drain terminal D is again connected to the output 16 via the matching network 14. The source terminal is connected to a reference potential, for example ground, via a high-frequency line comprising line portions 12a and 12b.

The element with adjustable ohmic resistance 20 is connected between a tap 30 between line portions 12a and 12b and a reference potential, for example ground. By changing the control voltage at the control terminal 22, again, the ohmic impedance applied between tap 30 and reference potential is adjustable, such that thereby the impedance of the circuit structure connected between source terminal of the transistor 10 and reference potential can be adjusted. Thereby, again, the oscillation frequency of the oscillator signal at the output 16 can be adjusted.

In the above description of embodiments of the invention, reference was made to line portions 18a, 18b or 12a and 12b. These line portions can be formed by separate high-frequency lines or by a single high-frequency line having a respective tap at a suitable position, for example at the center. In embodiments of the invention, the resonator lines or resonator line portions can be formed, for example, by microstrip lines or coplanar lines.

For monolithically integrated oscillators for the millimeter wave range 30 to 300 GHz, advantageously line resonators are used instead of oscillator circuits of capacitances and inductances, since in particular inductances can only hardly be realized with for this frequency range. In alternative embodiments, the oscillator circuit can also be implemented by discrete capacitive and inductive elements. In such a case, also, one or several elements with adjustable ohmic resistance, for example transistors, can be used for changing the impedance of the oscillator circuit in order to adjust the oscillation frequency of the oscillator signal. For example, in embodiments, transistor switches could be used to switch capacitances or inductances in and out of an oscillator circuit and thus vary the impedance of the oscillator circuit.

With reference to the above embodiments, only one element with adjustable ohmic resistance has been described. For people skilled in the art, it is obvious that several respective elements can be provided, for example in order to switch between a larger number than two effective resonator line lengths. Further, in alternative embodiments, elements can be provided with adjustable ohmic resistance, by which both the impedance of the oscillator circuit and the impedance of the switching structure provided for generating the negative input resistance can be varied.

In the described embodiments, the element with adjustable ohmic resistance is formed by a transistor. Alternatively, any ohmically variable element can be used as element with adjustable ohmic resistance, for example a diode or generally a voltage-dependent resistor.

The above embodiments have been described with reference to field-effect transistors. For people skilled in the art, it is obvious that instead of field-effect transistors bipolar transistors can also be used, wherein the source, drain and gate terminals are then to be replaced correspondingly by the emitter, collector and base terminals.

In the above embodiments, the oscillator circuit is connected to the control terminal (gate terminal or base terminal) of the transistor. As is obvious for people skilled in the art, depending on the used configuration, the oscillator circuit can be connected to any terminal (drain terminal or source terminal, and collector terminal or emitter terminal, respectively) of the transistor showing a negative input resistance, as long as the other terminals are connected such that an oscillatory system results.

Implementations for the matching network 14, for example to provide matching to a 50-ohm line and to allow power supply of the oscillator, are obvious to people skilled in the art and do not need any further explanation herein. In the same manner, the theory of oscillators where an active element at a terminal connected to a resonator provides a negative resistance is known to people skilled in the art. Appropriate connections of an active elements, such as a field-effect transistor or a bipolar transistor with an element for generating instability, such as an inductance, a capacitance and/or a high-frequency line in order to provide such a negative resistance, are obvious to a person skilled in the art and do also not need any further explanation.

Thus, embodiments of the present invention provide a novel approach for varying the oscillation frequency of a VCO, wherein higher tuning bandwidths can be realized compared to conventional methods. Further, the present invention provides an excellent integration option with existing circuit concepts, for example transmitting/receiving circuits and radar circuits on a chip, such that complete systems can be implemented smaller, lighter and in a more energy-saving manner with little effort.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Oscillator with an oscillation frequency adjustable in a voltage-controlled manner, comprising:
   an active device showing a negative input resistance at a terminal;
   an oscillator circuit coupled to the terminal of the active device showing the negative input resistance; and
   an element with an ohmic resistance adjustable in a voltage-controlled manner,
   a controller controlling the ohmic resistance of the element to intermediate values between an on state and an off state of the element so that the oscillation frequency of the oscillator can be continuously adjusted,
   wherein the oscillator circuit comprises a resonator line, wherein the length of the resonator line effective for oscillation generation is adjustable by the element with adjustable ohmic resistance.

2. Oscillator according to claim 1, wherein the impedance of the oscillator circuit can be adjusted by the element with adjustable ohmic resistance.

3. Oscillator according to claim 1, wherein the element with adjustable ohmic resistance is connected between a tap of the resonator line and a reference potential.

4. Oscillator according to claim 1, wherein the element with adjustable ohmic resistance is connected in series between portions of the resonator line.

5. Oscillator according to claim 1, wherein the element with adjustable ohmic resistance comprises a transistor.

\* \* \* \* \*